(12) United States Patent
Nashner et al.

(10) Patent No.: US 7,886,437 B2
(45) Date of Patent: Feb. 15, 2011

(54) PROCESS FOR FORMING AN ISOLATED ELECTRICALLY CONDUCTIVE CONTACT THROUGH A METAL PACKAGE

(75) Inventors: Michael Nashner, Portland, OR (US); Jeff Howerton, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 594 days.

(21) Appl. No.: 11/753,996

(22) Filed: May 25, 2007

(65) Prior Publication Data

US 2008/0289178 A1 Nov. 27, 2008

(51) Int. Cl.
*H01K 3/10* (2006.01)

(52) U.S. Cl. .................. 29/852; 257/774; 257/E29.119; 257/E23.011; 257/E21.577; 438/8; 438/689; 438/696; 438/694

(58) Field of Classification Search ............... 29/852; 257/E23.011, E23.067, E23.145, E29.119, 257/E21.577, E21.578, E21.774; 438/8, 438/689, 696, 694
See application file for complete search history.

(56) References Cited

U.S. PATENT DOCUMENTS

| | | | |
|---|---|---|---|
| 3,296,099 A * | 1/1967 | Dinella | ............ 205/126 |
| 4,155,972 A | 5/1979 | Hauser et al. | |
| 5,293,025 A | 3/1994 | Wang | |
| 5,518,964 A | 5/1996 | DiStefano et al. | |
| 5,593,606 A | 1/1997 | Owen et al. | |
| 5,614,114 A | 3/1997 | Owen | |
| 5,699,613 A | 12/1997 | Chong et al. | |
| 5,747,095 A | 5/1998 | McAllister et al. | |
| 5,757,079 A | 5/1998 | McAllister et al. | |
| 5,787,578 A | 8/1998 | Farooq et al. | |
| 5,801,441 A | 9/1998 | DiStefano et al. | |
| 5,951,349 A | 9/1999 | Larose et al. | |
| 6,021,564 A | 2/2000 | Hanson | |
| 6,104,087 A | 8/2000 | DiStefano et al. | |
| 6,194,291 B1 | 2/2001 | DiStefano et al. | |
| 6,211,485 B1 | 4/2001 | Burgess | |
| 6,235,544 B1 | 5/2001 | Franklin et al. | |
| 6,373,000 B2 * | 4/2002 | Nakamura et al. | ............ 174/264 |
| 6,416,844 B1 | 7/2002 | Robson | |
| 6,427,324 B1 | 8/2002 | Franklin et al. | |
| 6,541,709 B1 | 4/2003 | Franklin et al. | |
| 6,541,712 B1 | 4/2003 | Gately et al. | |
| 6,576,869 B1 | 6/2003 | Gower et al. | |
| 6,610,960 B2 | 8/2003 | De Steur et al. | |
| 6,627,844 B2 | 9/2003 | Liu et al. | |

(Continued)

FOREIGN PATENT DOCUMENTS

JP          07-201260          8/1995

(Continued)

*Primary Examiner*—Derris H Banks
*Assistant Examiner*—Azm Parvez
(74) *Attorney, Agent, or Firm*—Young Basile

(57) ABSTRACT

A method of forming an isolated electrically conductive contact through a metal substrate by creating at least one via through the substrate. The at least one sidewall of the via is cleaned and coated with a non-conductive layer. In one example, the non-conductive layer is formed by anodizing the sidewall(s) of the via. In another example, the non-conductive layer may be formed by thin film deposition of a dielectric on the sidewall(s). An electrically conductive filler is then placed into the via. In the examples disclosed, the filler may be a conductive ink or a conductive epoxy.

14 Claims, 6 Drawing Sheets

U.S. PATENT DOCUMENTS

| | | |
|---|---|---|
| 6,631,558 B2 | 10/2003 | Burgess |
| 6,635,553 B1 | 10/2003 | DiStefano et al. |
| 6,713,719 B1 | 3/2004 | De Steur et al. |
| 6,838,314 B2 | 1/2005 | Chang |
| 6,863,926 B2 * | 3/2005 | Lynn ............................ 427/250 |
| 6,881,662 B2 | 4/2005 | Kung et al. |
| 7,060,595 B2 | 6/2006 | Ou et al. |
| 2001/0045611 A1 | 11/2001 | Clatanoff et al. |
| 2002/0113312 A1 | 8/2002 | Clatanoff et al. |
| 2002/0190037 A1 | 12/2002 | Steur et al. |
| 2003/0066679 A1 | 4/2003 | Castro et al. |
| 2003/0183418 A1 | 10/2003 | Castro et al. |
| 2003/0190799 A1 | 10/2003 | Kung et al. |
| 2003/0196987 A1 | 10/2003 | Kung et al. |
| 2004/0112881 A1 | 6/2004 | Bloemeke et al. |
| 2004/0140560 A1 | 7/2004 | Harvey |
| 2005/0077083 A1 | 4/2005 | Mattix |
| 2005/0127478 A1 * | 6/2005 | Hiatt et al. ................... 257/621 |
| 2005/0137942 A1 * | 6/2005 | LaFleur ........................ 705/27 |
| 2005/0176272 A1 | 8/2005 | Rosenau |
| 2005/0189656 A1 | 9/2005 | Tan |
| 2006/0091023 A1 | 5/2006 | Bukhari et al. |
| 2007/0092739 A1 * | 4/2007 | Steele et al. ................. 428/450 |
| 2007/0170595 A1 * | 7/2007 | Sinha ......................... 257/774 |
| 2007/0275540 A1 * | 11/2007 | Hackitt et al. ............... 438/460 |
| 2008/0084404 A1 | 4/2008 | Andre et al. |
| 2008/0254207 A1 * | 10/2008 | Kuo ........................... 427/122 |
| 2008/0258309 A1 * | 10/2008 | Chiou et al. ................. 257/774 |

FOREIGN PATENT DOCUMENTS

| | | |
|---|---|---|
| JP | 2001-288595 A | 10/2001 |

* cited by examiner

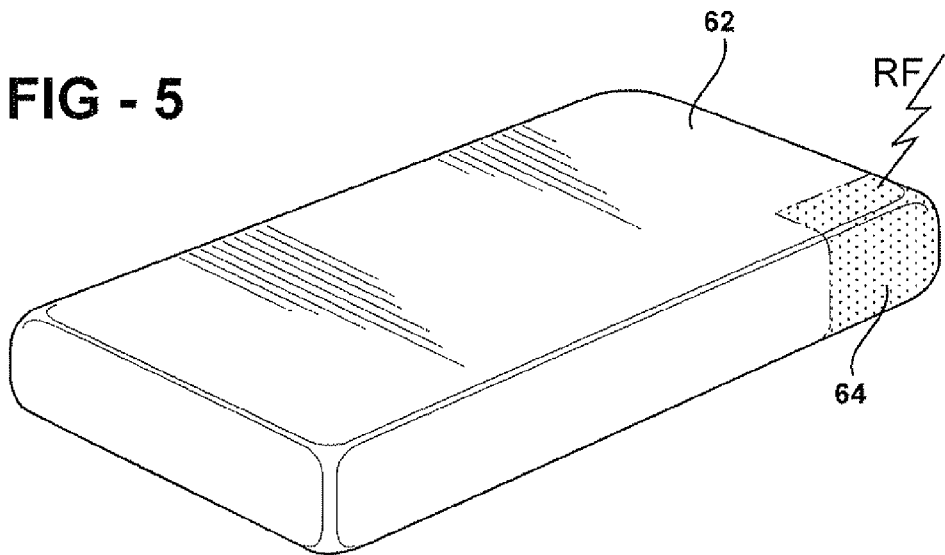

PROCESS FOR FORMING AN ISOLATED ELECTRICALLY CONDUCTIVE CONTACT THROUGH A METAL PACKAGE

FIELD OF THE DISCLOSURE

The field of the technical disclosure relates to a method for forming an electrically isolated contact in a metallic substrate and an apparatus including electrically isolated contact formed by the method disclosed herein.

BACKGROUND OF THE TECHNICAL SUBJECT MATTER

Metals are a frequently used as housings for a wide variety of products including consumer electronics. Aluminum is one metal that is sometimes used, in which case the aluminum is often anodized. In the case of aluminum packages they may be machined or extruded. To increase chemical and mechanical robustness aluminum may be anodized, forming a tough layer of insulating aluminum oxide several microns thick. The anodization provides a tough surface that prevents oxidation of the aluminum. The anodization can be infused with dyes to provide color to the package.

BRIEF SUMMARY

A method of creating an electrically isolated contact begins by forming a via in a metallic substrate. The via includes a sidewall on which an electrically insulating layer is formed. The via is filled with a conductive filler.

One example of how the electrically insulating layer is formed is anodization. Another example is thin film deposition.

In one example the via may be cleaned prior to forming the electrically insulating layer.

A package including a isolated conductive contact is also provided. The package may include a portion that is made from a metal substrate. The isolated conductive contact is formed in the substrate by forming a via therein. The sidewall of the via is coated with an electrically insulating material.

BRIEF DESCRIPTION OF THE DRAWINGS

The description herein makes reference to the accompanying drawings wherein like reference numerals refer to like parts throughout the several views, and wherein:

FIG. 5 is a schematic representation of an anodized metallic package with vias formed therein.

DETAILED DESCRIPTION OF THE PREFERRED EMBODIMENTS

Disclosed is a method to form one or more isolated electrical contacts in a metallic substrate. A via is drilled in a metal substrate. The sidewall(s) of the via may be cleaned using an etch. A non-conductive coating is formed on the via sidewall. In one example the via sidewalls are anodized. In another example the via sidewalls are coated with a dielectric using a film deposition process. A conductive material is then inserted into the via. In one example the conductive material is a conductive ink. In another example the conductive material is a conductive epoxy. Because the via sidewalls are non-conductive, electrical signals and/or current may pass through the conductive material without grounding or leaking out in the body of the substrate.

Figure 1:
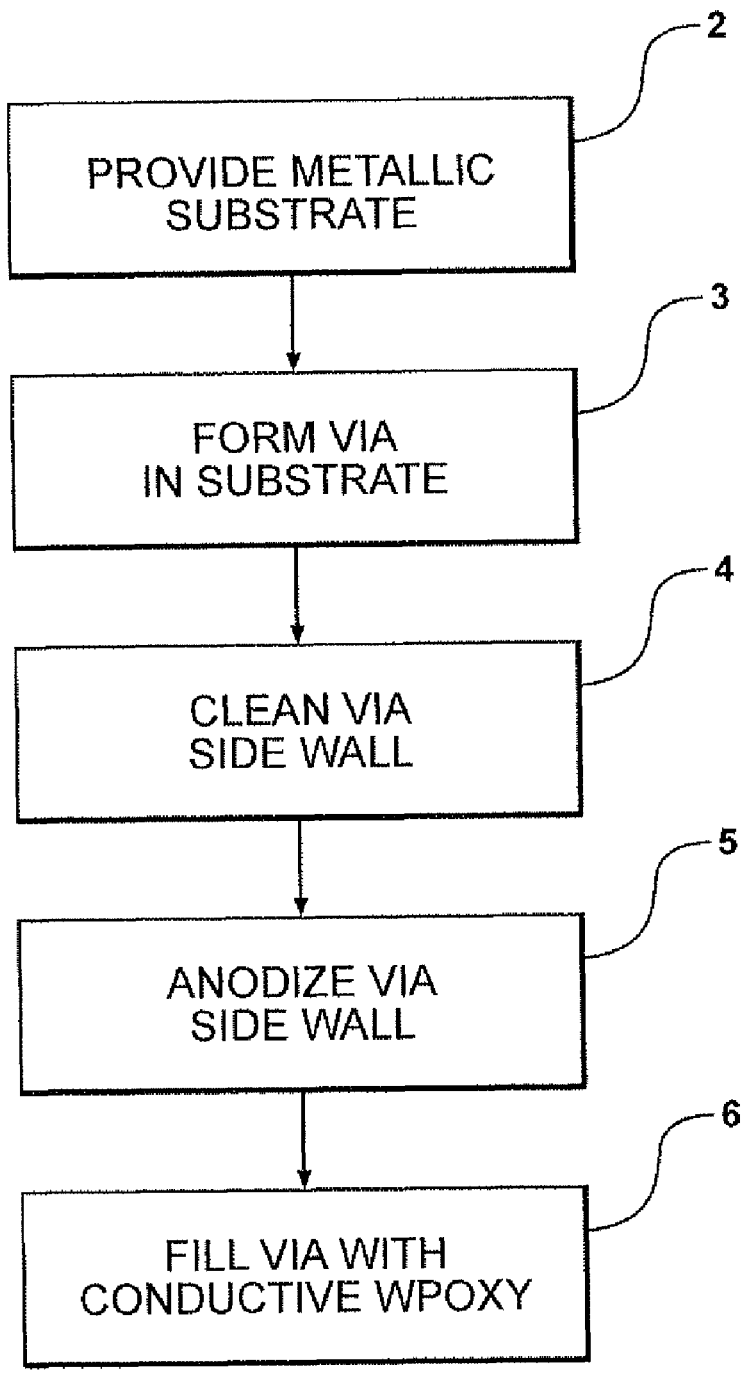
FIG. 1 is a flow chart illustrating an example of a sequence of acts to a create an isolated electrical contact in a metallic substrate.

With reference to FIG. 1 there is shown a schematic flow chart illustrating the acts associated with one example to form an isolated electrical contact. With reference to act 2 a metallic substrate is provided. In this example the metal is aluminum because it may be readily anodized, but other metals also may be readily anodized such as Titanium and Niobium. In act 3 at least one via is formed in the substrate. The substrate may be formed using a laser, a pulsed laser, a drill, an EDM or the like. After the via is formed its sidewalls (or sidewall when one continuous wall is formed, for example) are cleaned in act 4. In act 4 the entire substrate may be cleaned. Examples of cleaning techniques include, but are not limited to, high pressure air sprays, ultrasonic cleaning, fine grit sanding and/or chemical etches. An example of a chemical etch would be a Sodium Hydroxide Alkaline Etch. In act 5 the sidewall of the via is anodized. In act 5, if the substrate has not been anodized it may be anodized as well. Type I or Type II anodization may be used. In the examples shown herein the entire substrate is anodized after the via is formed. However, the substrate may be anodized prior to forming any via. In act 6 the vias are filled with a conductive material. Examples of conductive materials include electrically conductive inks such as those sold under the trade name Anapro or electrically conductive epoxies such as those sold under the trade name Masterbond. The epoxy sold under the trade name Anapro includes silver nano particles dispersed in a solvent that has a comparatively low viscosity.

The isolated electrical contacts formed by the method illustrated in FIG. 1 may be used for a wide variety of applications, including but not limited to antennas and touch sensors.

Figure 2:
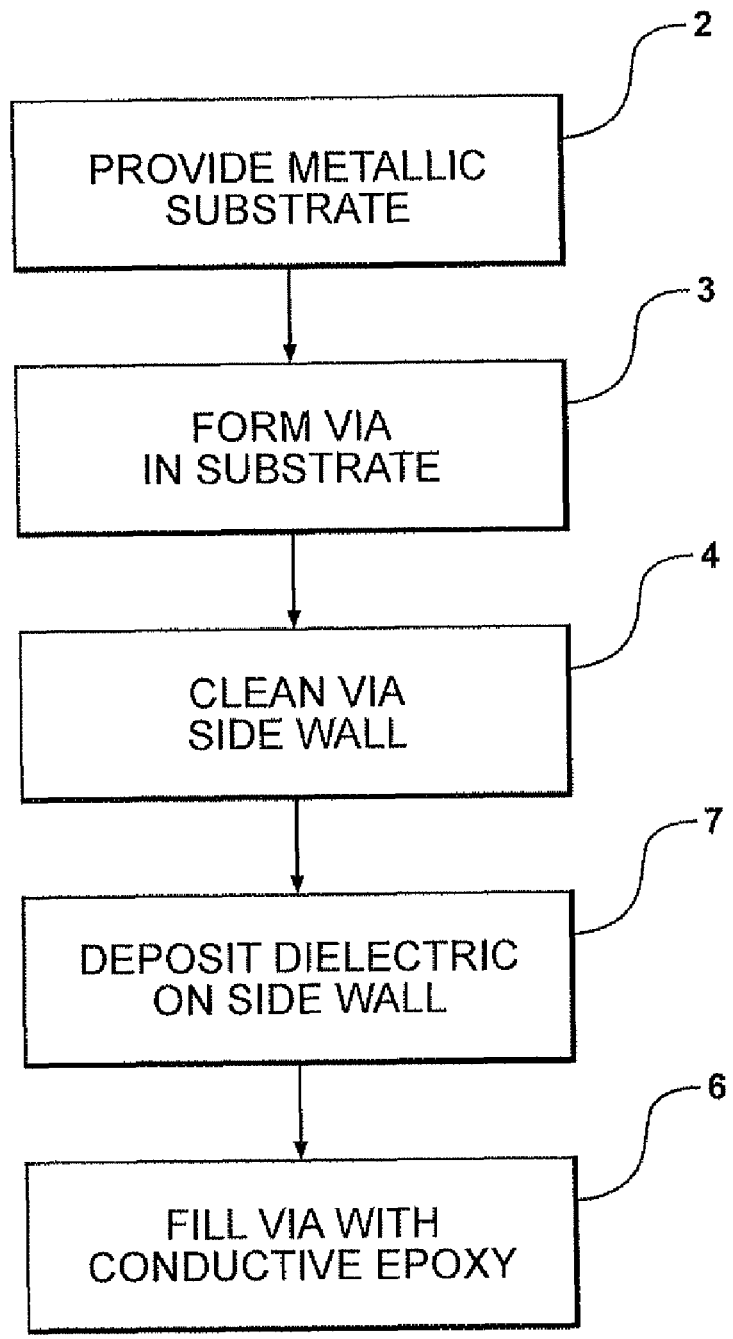
FIG. 2 is a flow chart illustrating a second example of a sequence of acts to create an isolated electrical contact in a metallic substrate.

With reference to FIG. 2 there is shown a schematic flow chart illustrating the acts associated with another example to form an isolated electrical contact. With reference to act 2 a metal substrate is provided. In this example the metal may be aluminum. In the example of FIG. 2, and in the case of aluminum, the aluminum substrate would be anodized. In act 3 at least one via is formed in the substrate. The substrate may be formed using a laser, a pulsed laser, a drill, an EDM or the like. After the via is formed, its sidewalls are cleaned in act 4 in such a manner to permit a traditional thin film deposition process to be executed on the via sidewalls. In act 7 the via is coated with a dielectric. In the example of FIG. 2 any of a number of thin film deposition techniques may be used to deposit the dielectric on the via sidewalls. For example, chemical vapor deposition (CVD) may be used to deposit a layer of silicon dioxide onto the via sidewalls. In act 6 the vias are filled with a conductive material. Examples of conductive materials include electrically conductive inks such as those sold under the trade name Anapro or electrically conductive epoxies such as those sold under the trade name Masterbond. As described above, the epoxy sold under the trade name Anapro includes silver nano particles dispersed in a solvent that has a comparatively low viscosity.

With reference to FIGS. 3A through 3D there is shown a metallic substrate having an isolated electrical contact being formed therein. A substrate 14 is provided. As shown, substrate 14 is neither anodized nor coated with a dielectric material. In another example, not shown herein, substrate 14 may be anodized or coated with a dielectric. Frequently such substrates may be used for a consumer electronic package and are formed of aluminum. Substrate 14 includes a first side 16 and a second side 18. Substrate 14 includes a thickness which, in this example, may be between 0.3 to 1.0 mm. As shown, a laser 46 may be used to form a via 30. One type of laser 46 is a diode-pumped solid-state pulsed laser using a circular or spiral pattern. It has been shown that a Nd:YAG 355 nm spot 22 with a pulse repetition rate of 30 kHz and 60 nanosecond pulse width is useful in machining out conical-shaped vias. Other lasers may be used, and other techniques may be used to form via 30. Examples of other ways via 30 may be formed are referenced above.

Via 30 may be conically shaped. Via 30 includes a sidewall 34, a first opening 40 and a second opening 44. Bach of openings 40 and 44 may be between 20 and 200 micrometers (μm). In one example, opening 40 is between approximately 90-100 micrometers (μm) in diameter, and opening 44 is between approximately 30-40 micrometers (μm) in diameter. In the example noted, many vias may formed patterned spaced arrays, such as that illustrated in FIG. 5, having for example, 100 micron spacing. Openings 44 may be difficult to detect upon visual inspection. Openings 44 may be further disguised by treating side 18 for example with various surface finishes, one example of which is bead-blasting.

The via sidewalls 34 may be cleaned. As noted above a wide variety of cleaning methods may be used. In the example where the sidewall 34 will be anodized, cleaning sidewall 34 improves the anodizing of the sidewall 34.

Figure 3A:
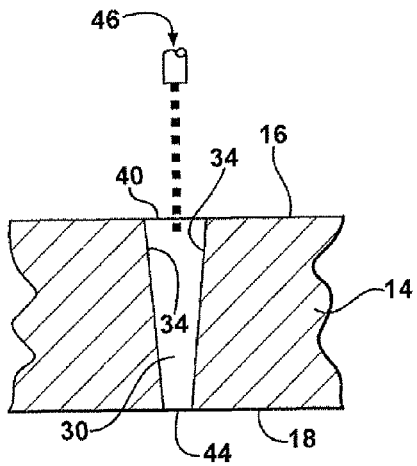
FIG. 3A schematically illustrates forming a via in a substrate.
Figure 3B:
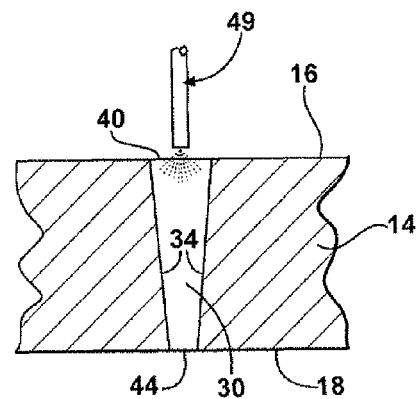
FIG. 3B schematically illustrates cleaning a via in a substrate.
Figure 3C:
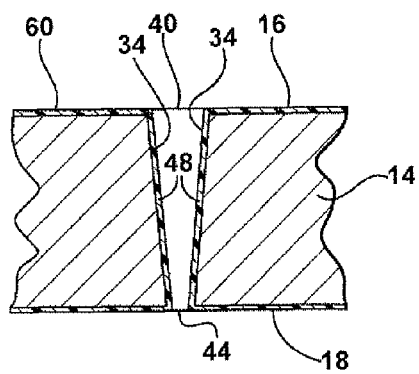
FIG. 3C schematically illustrates anodizing a sidewall of a via in a substrate.

With reference to FIG. 3C sidewall 34 may be anodized or coated with a dielectric material. In the case of sidewall 34 being anodized it may be more efficient as shown in the example of FIG. 3C to anodize the entire substrate 14 at the same time sidewall 34 is anodized. In this case the entire substrate 14, including via sidewall 34 may be cleaned at one time. As noted above, type I or type II anodizing may be used. By anodizing sidewall 34, an insulative sleeve 48 is formed on sidewall 34. In the example of FIG. 2 it may be more efficient to provide a metal substrate that is anodized prior to forming via 30 and depositing a thin film on the via sidewall 34.

In the event that substrate 14 has not been anodized prior to forming via 30, first and second sides 16 and 18 may be anodized at the same time as sidewall 34. In the example where substrate 14 is formed from aluminum, the anodization process may form a surface 60 of aluminum oxide between 5 microns and 75 microns thick. The thickness of the anodized layer that forms insulative sleeve 48 may be approximately 5 microns thick and should not completely close off opening 44.

Figure 3D:
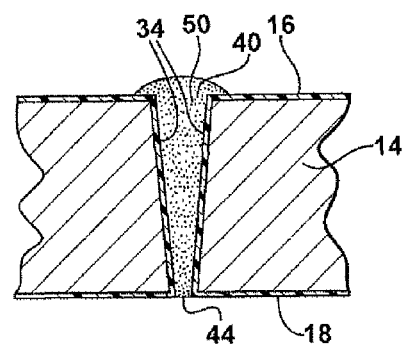
FIG. 3D schematically illustrates filling the via of FIG. 1C with a conductive material.

With reference to FIG. 3D an electrically conductive filler material 50 fills via 30. One example of an electrically conductive filler material 50 is a silver nano particle liquid conductive ink, sold under the trade name Anapro. Via 30 may be filled with the filler material 50 using various forms of fill methodologies. In the case of Anapro an ink jet method may be used. Anapro is a conductive ink that dries in via 30. Another fill material that may be used is sold under the trade name Masterbond. Masterbond is a two part conductive epoxy that may be injected into via 30. Masterbond is a liquid and cures in via 30 after it has been injected. Because fill material 50 is conductive and sidewall 34 is non-conductive an isolated conductive contact is formed. Electrical signals may pass through fill material 50 without shorting out into substrate 14. Further, when multiple vias are provided, sets of vias may be in isolation from other vias so that different electrical signals may be passed through different filled vias.

FIGS. 4A through 4E illustrate another embodiment to create an isolated electrical contact. As shown, substrate includes a pocket 24 extending into the thickness 20 of the substrate 14 so that the substrate at the pocket 24 has a thickness 22. Pocket 24 may be formed in the substrate as part of the method, or substrate may be provided with a pocket preformed therein. In the illustrated example pocket 24 is formed in substrate 14, leaving sidewalls 26 and base 28 of pocket 24 exposed to the conductive substrate 14. In the example illustrated in FIGS. 4A through 4E, vias 30 are formed in substrate 14 at base 28 of pocket 24. Also in the example vias are cleaned in a manner similar to the example of FIGS. 3A-3D. In the example of FIGS. 4A through 4E, the sidewalls 26 of pocket 24 may be cleaned at the same time as via sidewall 34.

As shown in FIG. 40 sidewalls 26, base 28 and via sidewall 34 may be anodized. In this case it may be more efficient to anodize the entire substrate 14 at the time sidewalls 26, base 28 and via sidewall 34 are anodized. Alternately, in another example using aluminum the substrate may be anodized prior to forming pocket 24 or vias 30. In the alternate example sidewalls 26, base 28 and via sidewall 34 may be coated with a dielectric material using, for example, a CVD technique.

Figure 4A:
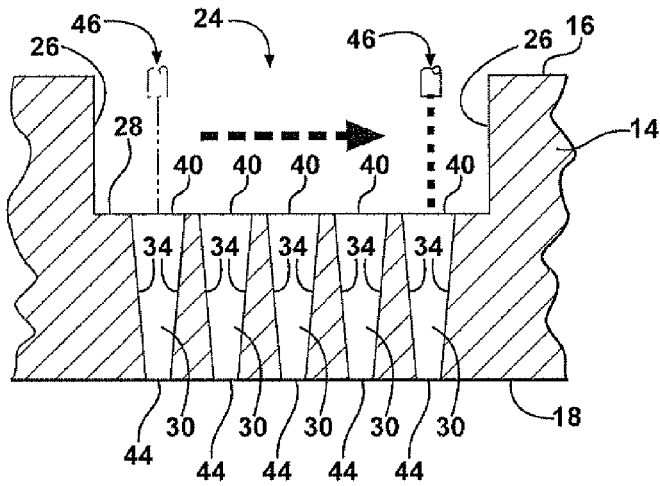
FIG. 4A schematically illustrates forming a plurality of vias in a pocket area of a substrate.
Figure 4B:
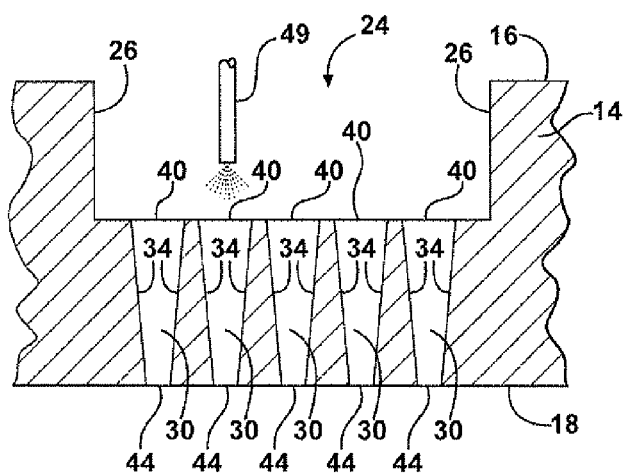
FIG. 4B schematically illustrates cleaning a plurality of vias in a pocket of a substrates.
Figure 4C:
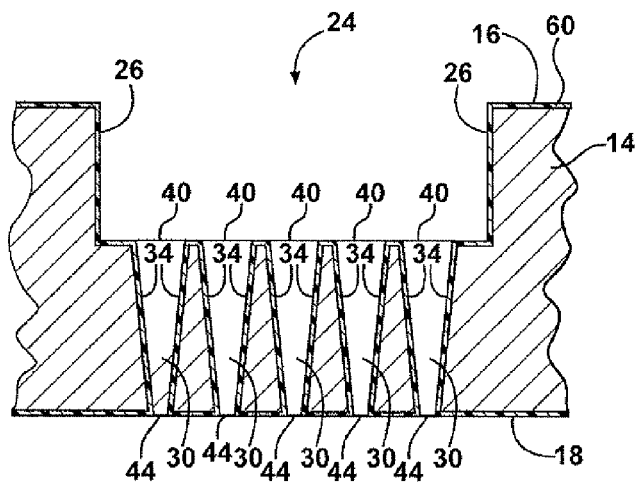
FIG. 4C schematically illustrates anodizing the sidewall of a plurality of vias.
Figure 4D:
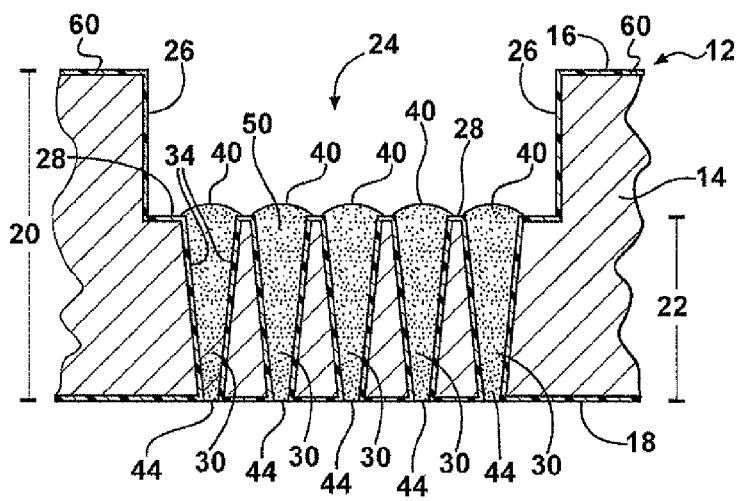
FIG. 4D schematically illustrates filling a plurality of vias with a conductive material.
Figure 4E:
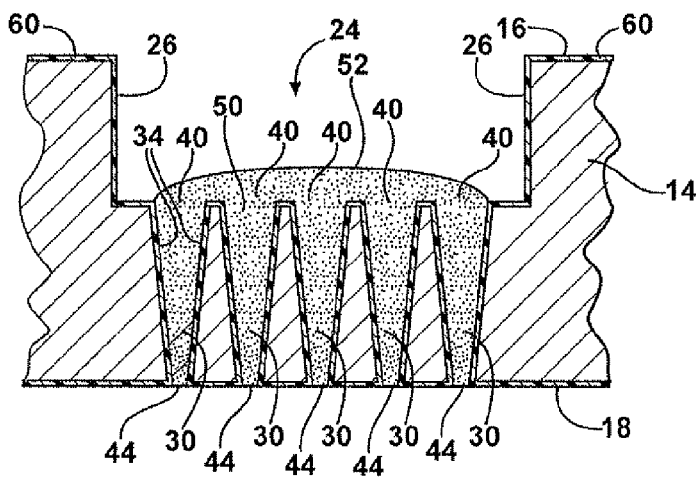
FIG. 4E schematically illustrates filling a plurality of vias with a conductive material.
Figure 4F:
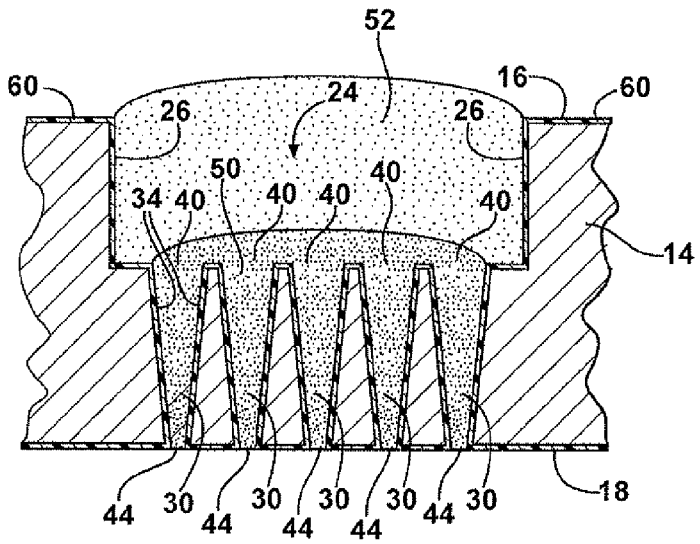
FIG. 4F schematically illustrates a pocket filled with a conductive material together with vias filled with a conductive material.

With reference to FIGS. 4D and 4E an electrically conductive filler 50 is placed into vias 30. Conductive filler may be discretely placed into vias 30 as shown in FIG. 4D or may be placed into vias 30 in gross as shown in FIG. 4E. As shown in FIG. 4F, pocket 24 may be further filled with a conductive material 52. Conductive material 52 may be the same as conductive material 50 or may be a different material.

FIG. 5 illustrates a package 62 having an area 64 including isolated electrical contacts. Area 64 is illustrated as containing a series of flecks to symbolize isolated electrical contacts, but in application isolated electrical contacts may be more difficult to visualize than the flecks illustrated in area 64. Area 64 may be used as an antenna for a cell phone, or in another example physical contact with area 64 may function to turn an electronic device on or off. Also, alpha numeric symbols maybe associated with isolated electrical contacts to act as key sensors. These sensors may appear to be part of the anodized metallic package 62, but in fact contact one or more isolated electrical contacts.

While the method has been described in connection with what is presently considered to be the most practical and preferred embodiments, it is to be understood that the method is not to be limited to the disclosed embodiments but, on the contrary, is intended to cover various modifications and equivalent steps and arrangements included within the scope of the invention and any appended claims.

What is claimed is:

1. A method of creating an electrically isolated contact comprising:
   forming a via in a metallic substrate wherein the via includes a first opening in a top surface of the metallic substrate, a second opening in an opposing bottom surface of the metallic substrate and at least one sidewall extending between the first opening and the second opening;
   forming a dielectric sleeve on the at least one sidewall of the via, the dielectric sleeve formed through anodization; and
   filling the via with an electrically conductive material.

2. The method as in claim 1 wherein the substrate is comprised of aluminum and the aluminum is anodized after the via is formed.

3. The method as in claim 2 wherein the at least one sidewall of the via is cleaned with an etching process prior to anodizing.

4. The method as in claim 3 wherein the via is cleaned using a sodium hydroxide alkaline etch.

5. The method as in claim 1 wherein the substrate includes a pocket formed therein, the pocket including at least one sidewall and a base and the via being formed in the base of the pocket.

6. The method as in claim 1 wherein the electrically conductive material is a silver nano particle liquid conductive epoxy.

7. A housing having an isolated electrical contact wherein the isolated electrical contact comprises:
   a via having a first opening in a top surface of a portion of the housing, a second opening in an opposing bottom surface of the portion and a via sidewall extending between the first opening and the second opening;
   an electrically insulating sleeve formed on the via sidewall; and
   a conductive filler captured by the insulating sleeve of the via sidewall, wherein the housing is made from aluminum and the insulating sleeve is a layer of anodized aluminum.

8. The housing as in claim 7 comprising a portion of an antenna using a plurality of isolated electrical contacts.

9. A housing made from a metal and having an isolated electrical contact wherein the isolated electrical contact is formed by a method comprising:
   forming a via in the housing through drilling using a laser, the via including a first opening in a top surface of a portion of the housing, a second opening in an opposing bottom surface of the portion and at least one sidewall extending between the first opening and the second opening;
   cleaning the housing and the at least one sidewall;
   anodizing the housing and the at least one sidewall; and
   filling the via with an electrically conductive filler.

10. The housing as in claim 9 wherein the via has a diameter between 20 and 200 microns.

11. The housing in claim 10 wherein the isolated electrical contact operates as an on/off switch.

12. The method of claim 1 wherein the electrically conductive material is a conductive ink.

13. The housing of claim 7 wherein the electrically conductive filler is a conductive ink.

14. The housing of claim 9 wherein the electrically conductive filler is a conductive ink.

* * * * *